(12) United States Patent
Wehlus et al.

(10) Patent No.: US 9,960,381 B2
(45) Date of Patent: May 1, 2018

(54) LIGHTING DEVICE, METHOD FOR PRODUCING A LIGHTING DEVICE

(71) Applicant: Osram OLED GmbH, Regensburg (DE)

(72) Inventors: Thomas Wehlus, Lappersdorf (DE); Daniel Riedel, Regensburg (DE); Nina Riegel, Tegernheim (DE); Silke Scharner, Regensburg (DE); Johannes Rosenberger, Regensburg (DE); Arne Fleissner, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days. days.

(21) Appl. No.: 15/310,469

(22) PCT Filed: Apr. 20, 2015

(86) PCT No.: PCT/EP2015/058507
§ 371 (c)(1),
(2) Date: Nov. 11, 2016

(87) PCT Pub. No.: WO2015/172975
PCT Pub. Date: Nov. 19, 2015

(65) Prior Publication Data
US 2017/0125722 A1    May 4, 2017

(30) Foreign Application Priority Data
May 12, 2014   (DE) .......... 10 2014 106 634

(51) Int. Cl.
*H01L 51/52*   (2006.01)
*H01L 27/32*   (2006.01)
*H01L 51/56*   (2006.01)

(52) U.S. Cl.
CPC ...... *H01L 51/5212* (2013.01); *H01L 27/3202* (2013.01); *H01L 51/5237* (2013.01);
(Continued)

(58) Field of Classification Search
CPC ............. H01L 51/5212; H01L 51/5228; H01L 51/5262; H01L 51/5268; H01L 51/5275
See application file for complete search history.

(56) References Cited

U.S. PATENT DOCUMENTS

2007/0013293 A1*  1/2007  Cok ................. B82Y 20/00
                                                              313/504
2007/0079869 A1*  4/2007  Yukinobu ............ H01G 9/2022
                                                              136/263
(Continued)

FOREIGN PATENT DOCUMENTS

CN    102172101 A    8/2011
CN    103155194 A    6/2013
(Continued)

OTHER PUBLICATIONS

German Search Report based on application No. 10 2014 106 634.0 (10 pages) dated Mar. 5, 2015 (Reference Purpose Only).
(Continued)

*Primary Examiner* — Bryan Junge
(74) *Attorney, Agent, or Firm* — Viering, Jentschura & Partner mbB

(57) ABSTRACT

A lighting device may include a substrate having a carrier, a first electrical busbar, a second electrical busbar, and an optically functional structure on or above the carrier, wherein the optically functional structure is formed laterally between the first and the second electrical busbar, and a first electrode electrically coupled to the first electrical busbar and/or the second electrical busbar, on or above the carrier, and an organic functional layer structure on or above the first
(Continued)

electrode, wherein the organic functional layer structure is formed for converting an electric current into an electromagnetic radiation, and a second electrode on or above the organic functional layer structure. The optically functional structure is formed in such a way that the beam path of the electromagnetic radiation which passes through the substrate and/or the spectrum of the electromagnetic radiation passing through the substrate are/is variable by means of the optically functional structure.

5 Claims, 7 Drawing Sheets

(52) U.S. Cl.
CPC ...... *H01L 51/5268* (2013.01); *H01L 51/5275* (2013.01); *H01L 51/56* (2013.01)

(56) References Cited

U.S. PATENT DOCUMENTS

| | | | |
|---|---|---|---|
| 2008/0042552 A1* | 2/2008 | Cok | B82Y 20/00 313/501 |
| 2011/0180308 A1* | 7/2011 | Nakamura | H01L 51/5268 174/255 |
| 2013/0287936 A1* | 10/2013 | Jang | H01L 51/5212 427/98.4 |
| 2014/0021492 A1* | 1/2014 | Wolk | H01L 51/5275 257/88 |
| 2014/0048788 A1 | 2/2014 | Lee et al. | |
| 2016/0268538 A1* | 9/2016 | Schwab | H01L 51/5212 |

FOREIGN PATENT DOCUMENTS

| | | |
|---|---|---|
| CN | 103608944 A | 2/2014 |
| EP | 2352360 A1 | 8/2011 |
| EP | 2613374 A2 | 7/2013 |
| EP | 2629347 A1 | 8/2013 |
| EP | 2693510 A2 | 2/2014 |
| WO | 2009014707 A2 | 1/2009 |

OTHER PUBLICATIONS

International Search Report based on application No. PCT/EP2015/058507 (4 pages) dated Sep. 11, 2015 (Reference Purpose Only).

Chinese Office Action based on application No. 201580025029.8 (8 pages and 14 pages of English translation) dated Nov. 16, 2017 (Reference Purpose Only).

\* cited by examiner

LIGHTING DEVICE, METHOD FOR PRODUCING A LIGHTING DEVICE

RELATED APPLICATIONS

The present application is a national stage entry according to 35 U.S.C. § 371 of PCT application No. PCT/EP2015/058507 filed on Apr. 20, 2015, which claims priority from German application No. 10 2014 106 634.0 filed on May 12, 2014, and is incorporated herein by reference in its entirety.

TECHNICAL FIELD

In various embodiments, a lighting device and a method for producing a lighting device are provided.

BACKGROUND

Printing processes are becoming ever more important in the production of electronic components. Especially the printing of substrates for organic light emitting diodes (OLEDs), with regard to different OLED designs, is an area having high potential for reducing costs and for increasing the flexibility of production.

A conventional OLED substrate includes above a substrate electrical busbars and an internal extraction layer (IEL). An anode and a cathode with an organic functional layer system between the anode and cathode are formed above the substrate. The organic functional layer system may include one or a plurality of emitter layer(s) in which electromagnetic radiation is generated, one or a plurality of charge generating layer structure(s) each composed of two or more charge generating layers (CGL) for charge generation, and one or a plurality of electron blocking layers, also designated as hole transport layer(s) (HTL), and one or a plurality of hole blocking layers, also designated as electron transport layer(s) (ETL), in order to direct the current flow.

Conventionally, the electrical busbars are deposited on the anode or incorporated in the substrate. The production of incorporated electrical busbars in the substrate is relatively complex and inflexible with regard to different OLED designs.

Material of the further layers above the carrier accumulates at the electrical busbars, said material being applied in further wet coatings above the carrier. Furthermore, elevated electrical busbars entail the risk of short circuits on account of layer thickness inhomogeneities in the electrically functional layers deposited thereabove, that is to say the anode, cathode and the organic functional layer system. Elevated electrical busbars therefore conventionally require a laterally structured insulating coating—which is complex to process—for planarization, for example with a photoresist.

SUMMARY

In various embodiments, a lighting device and a method for producing a lighting device are provided which make it possible to realize novel substrate concepts. One of these novel concepts involves bringing together electrical busbars and an optically functional structure, for example an internal extraction layer (IEL), in one plane. As a result, a busbar structure can be combined with an optically functional structure in a simple and effective manner. As a result, the substrate can be planar and be free of elevated structures.

In various embodiments, a lighting device as claimed in claim 1 and a method for producing a lighting device as claimed in claim 12 are provided.

In various embodiments, a lighting device is provided. The lighting device includes a substrate having a carrier, a first electrical busbar on or above the carrier; a second electrical busbar on or above the carrier, and an optically functional structure on or above the carrier. The optically functional structure is formed between the first electrical busbar and the second electrical busbar. An organic functional layer structure is formed on or above the substrate, wherein the organic functional layer structure is formed for converting an electric current into an electromagnetic radiation. A second electrode is formed on or above the organic functional layer structure. The optically functional structure is formed in such a way that the beam path of the electromagnetic radiation through the substrate and/or the spectrum of the electromagnetic radiation are/is variable.

The carrier can be formed as transparent or translucent with respect to at least part of the electromagnetic radiation, for example in the visible wavelength range.

A busbar is a linear line for combining and forwarding electrical energy. The linear line can be singularly or repeatedly bent, buckled, curved, wound or can be straight.

In various configurations, a first electrical busbar and a second electrical busbar can be different lines or line sections of a single electrical busbar, for example in the case of an electrical busbar having two or more lines or line sections running parallel to one another. Alternatively, the first electrical busbar and the second electrical busbar can be electrical busbars or lines that are electrically insulated from one another. The electrical busbars or lines that are electrically insulated from one another can be formed in such a way that they can have an identical or different electrical potential for example during the operation of the lighting device.

The first electrical busbar is formed at a distance from the second electrical busbar. The first electrical busbar is formed alongside the second electrical busbar on or above the carrier.

In various configurations, at least one electrical busbar can be arranged or formed areally on the carrier, for example with parallel tracks, for example in the form of a meander, a spiral of a net or lattice. As a result, for example, a current distribution can be made possible by means of a single electrical busbar over a large region of an electrode, for example over the entire area of an electrode.

In various configurations, the first electrical busbar and the second electrical busbar can be part of a current distribution structure. In other words: in various configurations, the substrate includes a current distribution structure, wherein the current distribution structure includes at least one electrical busbar.

In various configurations, the electrical current distribution structure may include two or more electrical busbars, wherein the plurality of electrical busbars have an arrangement in a lattice or net structure or in the form of parallel tracks. The lattice or net structure can be formed for example areally on the carrier.

The optically functional structure may include or be formed from a transparent or translucent substance. The optically functional structure is formed in such a way that it reduces the roughness of the exposed surface of the substrate, for example planarizes or levels the surface of the carrier with busbar. In other words: the "macroscopic roughness" formed by means of the busbars can be compensated for or reduced by means of the optically functional structure. The optically functional structure is intended substantially not to reduce or compensate for the intrinsic roughness of the carrier.

Alternatively, by means of a two-material system, also designated as two-layer stack, the material situated at the bottom is intended to be planarized by the overlying material. By way of example, a particle-based scattering film can be planarized by means of an overlying layer without particles.

In various configurations, the optically functional structure may include or be formed from a dielectric substance.

In various configurations, the optically functional structure may include or be formed from an electrically conductive substance.

In one configuration, the electrically conductive optically functional structure may include or be formed from a dopant in a matrix.

In various configurations, the optically functional structure can be formed as or include an electrical insulation between the first electrical busbar and the second electrical busbar.

In various configurations, the optically functional structure may include particles in a matrix.

The particles can be formed such that they are non-scattering with respect to visible light.

Alternatively or additionally, the optically functional structure may include particles which are formed such that they are scattering with respect to visible light.

The matrix can be formed for example in an amorphous fashion, for example as a glass. The matrix may include or be formed from a molding material and/or a potting material.

The particles can be distributed in the matrix in such a way that the optically functional structure in the visible wavelength range of the electromagnetic radiation has a layer-thickness-averaged refractive index difference relative to the electrically active region and/or the carrier which is greater than 0.05.

In various configurations, the particles may include or be formed from a material that at least partly absorbs the electromagnetic radiation, for example a wavelength-converting material, for example a phosphor or colorant.

In various configurations, the optically functional structure may include at least one first layer and one second layer. The first layer and the second layer can be formed identically or differently.

In one configuration, the optically functional structure can be formed as a mirror structure, for example as a photonic crystal.

In various configurations, the optically functional structure can have a substantially homogeneous cross section.

In various configurations, the optically functional structure can be formed laterally between the first electrical busbar and the second electrical busbar.

In various configurations, the optically functional structure can be formed in such a way that the first electrical busbar and the second electrical busbar are exposed, for example at the surface of the substrate, for example in order that the exposed electrical busbars are electrically contactable.

In various configurations, the optically functional structure can be formed in such a way that the optically functional structure overfills the first electrical busbar and/or the second electrical busbar. The overfilled part of the optically functional structure may include or form for example a substantially smooth surface, for example at least in the region of the overfilled busbar.

In various configurations, the substrate may include an electrical insulating between the optically functional structure and the first electrical busbar and/or the second electrical busbar. The electrical insulation can be formed in such a way that the optically functional structure is electrically insulated at least from one of the electrical busbars.

In various configurations, the optically functional structure can be formed as a coupling structure with respect to the electromagnetic radiation, for example as a coupling-in structure or extraction structure, for example in the visible wavelength range.

In various configurations, the optically functional structure may include at least one region which is formed as a waveguide for at least part of the electromagnetic radiation, for example with regard to a wavelength range and/or a polarization direction, for example in the visible wavelength range, for example for unpolarized light.

In various configurations, the optically functional structure can be formed as a filter structure of the electromagnetic radiation, for example with regard to at least one wavelength range and/or a polarization direction, for example as a bandpass, long-pass, short-pass or cut-off filter, for example with respect to UV radiation and/or infrared radiation.

In various configurations, the optically functional structure can be formed as an antireflection coating, for example with regard to at least one wavelength range, for example in the visible wavelength range.

In various configurations, the optically functional structure can be formed as a wavelength-converting structure. The wavelength-converting structure includes a colorant or phosphor, for example.

In various configurations, the lighting device can furthermore include a first electrode, wherein the first electrode is formed between the substrate and the organic functional layer structure.

Alternatively or additionally, the lighting device may include a first electrode formed between the optically functional structure and the first electrical busbar and/or the second electrical busbar. Alternatively or additionally, the first electrode can be formed between the carrier and the first electrical busbar and/or the second electrical busbar.

In various configurations, the first electrical busbar and the second electrical busbar can be formed above the carrier on the first electrode. Alternatively or additionally, the optically functional structure can be formed above the carrier on the first electrode.

In various configurations, the first electrode can be formed on the first electrical busbar, the second electrical busbar and/or the optically functional structure.

In various configurations, the first electrical busbar can be electrically insulated electrically from the second electrical busbar; and the first electrical busbar can be electrically coupled to the first electrode and the second electrical busbar can be electrically coupled to the second electrode.

The current distribution structure, for example in the form of the first electrical busbar and/or the second electrical busbar, may include one or a plurality of lines extending along the surface of the substrate, for example along an interface of the substrate with the first electrode and/or organic functional layer structure.

In various embodiments, a method for producing a lighting device is provided. The method includes forming a substrate. Forming the substrate includes providing a carrier; forming a first electrical busbar on or above the carrier; forming a second electrical busbar on or above the carrier; and forming an optically functional structure on or above the carrier. The optically functional structure, the first electrical busbar and the second electrical busbar are formed in such a way that the optically functional structure is formed between the first electrical busbar and the second electrical busbar on or above the carrier. Furthermore, the method for producing the lighting device includes forming an organic functional layer structure on or above the substrate, wherein the organic functional layer structure is formed for converting an electric current into an electromagnetic radiation; and forming a second electrode on the organic functional layer structure. The optically functional structure is formed in such a way that the beam path of the electromagnetic radiation through the substrate and/or the spectrum of the electromagnetic radiation are/is variable.

The variation of the beam path and/or spectrum can be related to a lighting device without an optically functional structure. Alternatively or additionally, the variation of the beam path and/or spectrum can be related to a variation of an operating state of the optically functional structure, for example in the case of an optically functional structure including a polarized or polarizable substance.

In various configurations, the first electrical busbar and the second electrical busbar can be formed in the optically functional structure.

Alternatively, the optically functional structure can be formed between the first electrical busbar and the second electrical busbar.

In various configurations, the optically functional structure, the first electrical busbar and/or the second electrical busbar can be deposited in one or a plurality of plies on or above the carrier. A first ply and a second ply formed directly on the first ply can be formed from the same substance or different substances.

The optically functional structure can be formed in such a way that it acts as a supporting structure for forming the first electrical busbar and/or the second electrical busbar, for example laterally enclose or reshape the regions in which the first supporting structure and the second supporting structure are formed.

In one configuration, the method may include forming a first electrode on or above the substrate, wherein the organic functional layer structure is formed on or above the first electrode.

In various configurations, the method for producing a lighting device may include features of the lighting device; and the lighting device may include features of the method for producing the lighting device in such a way and insofar as the features are in each case meaningfully applicable.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
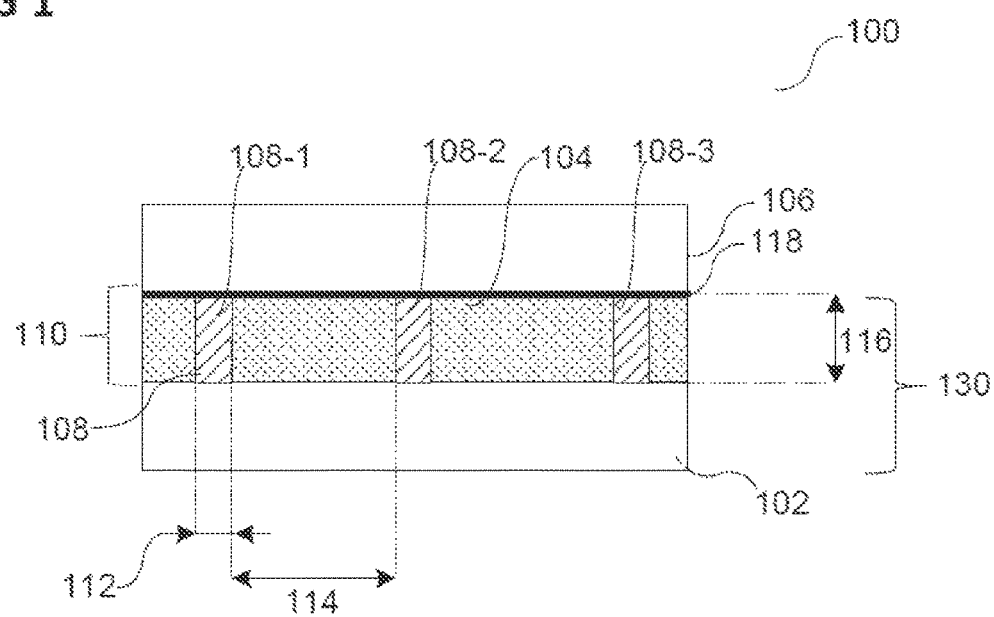
FIG. 1 shows a schematic illustration of a region of a lighting device in accordance with various embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, lighting devices are described, wherein a lighting device includes an optically active region. The optically active region can emit electromagnetic radiation by means of a voltage applied to the optically active region. In various embodiments, the lighting device can be formed in such a way that the electromagnetic radiation has a wavelength range including X-ray radiation, UV radiation (A-C), visible light and/or infrared radiation (A-C).

A lighting device can be formed for example as a light emitting diode (LED), as an organic light emitting diode (OLED), as a light emitting transistor or as an organic light emitting transistor, for example an organic field effect transistor (OFET) and/or an organic electronic system. Furthermore, a plurality of electromagnetic radiation emitting components can be provided, for example in a manner accommodated in a common housing. The lighting device may include an organic functional layer system, which is synonymously also designated as organic functional layer structure. The organic functional layer structure may include or be formed from an organic substance or an organic substance mixture which is designed for example for emitting an electromagnetic radiation from an electric current provided, for example include an electroluminescence substance or an electroluminescence substance mixture in the current path.

A lighting device, for example an organic light emitting diode, can be formed as a so-called top emitter and/or a so-called bottom emitter. In the case of a bottom emitter, electromagnetic radiation is emitted from the electrically active region through the carrier. In the case of a top emitter, electromagnetic radiation is emitted from the top side of the electrically active region and not through the carrier.

A top emitter and/or a bottom emitter can also be formed as optically transparent or optically translucent; by way of example, each of the layers or structures described below can be formed as transparent or translucent with respect to the absorbed or emitted electromagnetic radiation.

In various embodiments, the term "translucent" or "translucent layer" can be understood to mean that a layer is transmissive to light, for example to the light generated by the light emitting component, for example in one or more wavelength ranges, for example to light in a wavelength range of visible light (for example at least in a partial range of the wavelength range of 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of 380 nm to 780 nm), wherein light coupled into a structure (for example a layer) is also coupled out from the structure (for example layer) without scattering or light conversion.

In various embodiments, the optically functional structure may include or be formed from one colorant or a plurality of colorants, for example for an optically functional structure formed in a colored fashion as filter structure or for representing information. A colorant can be a chemical compound or a pigment that can color a structure, i.e. alters the appearance for a wavelength range, for example visible wavelength range. The colorant can be for example an organic colorant, for example from one of the following substance classes: acridine, acridone, anthraquinone, anthracene, cyanine, dansyl, squaryllium, spiropyrans, borondipyrromethanes (BODIPY), perylenes, pyrenes, naphthalenes, flavins, pyrroles, porphyrins and the metal complexes thereof, diarylmethane, triarylmethane, nitro, nitroso, phthalocyanine and the metal complexes thereof, quinones, azo, indophenol, oxazines, oxazones, thiazines, thiazoles, xanthenes, fluorenes, flurones, pyronines, rhodamines, coumarins, metallocenes. Alternatively, at least one of the colorants may include or be formed from an inorganic substance from the group of the inorganic colorant classes, inorganic colorant derivatives or inorganic colorant pigments: transition metals, rare earth oxides, sulfides, cyanides, iron oxides, zirconium silicates, bismuth vanadate, chromium oxides. Alternatively, at least one of the colorants may include or be formed from nanoparticles, for example carbon, for example carbon black, gold, silver, platinum.

In various embodiments, the optically functional structure may include or be formed from one or more phosphor(s). The at least one phosphor is energetically excited by means of at least part of the electromagnetic radiation. Upon the subsequent energetic deexcitation, the phosphors emit an electromagnetic radiation of one or more predefined wavelength spectra, for example light colors. A conversion of the electromagnetic radiation thus takes place. During the conversion, the wavelengths of the absorbed part of the electromagnetic radiation are shifted to shorter or longer wavelengths. The light colors can be individual colors or mixed colors. The individual colors may include for example green, red or yellow light and/or the mixed colors can be mixed for example from green, red and/or yellow light and/or include white light, for example. The formation of electromagnetic radiation having a second wavelength from electromagnetic radiation having a first wavelength is called wavelength conversion. Wavelength conversion is used in lighting devices for the color conversion, for example for simplifying the generation of white light. In this case, for example, a blue light is converted into a yellow light. The color mixing of blue light and yellow light forms white light. The phosphor is thus a substance which converts with losses electromagnetic radiation having one wavelength into electromagnetic radiation having a different wavelength, for example a longer wavelength (Stokes shift) or a shorter wavelength (anti-Stokes shift), for example by means of phosphorescence or fluorescence. The at least one phosphor can be or include for example a substance from the following substances: garnets, nitrides, silicates, oxides, phosphates, borates, oxynitrides, sulfides, selenides, aluminates, tungstates, and halides of aluminum, silicon, magnesium, calcium, barium, strontium, zinc, cadmium, manganese, indium, tungsten, and other transition metals or rare earth metals such as yttrium, gadolinium or lanthanum, which are doped with an activator, such as, for example, copper, silver, aluminum, manganese, zinc, tin, lead, cerium, terbium, titanium, antimony or europium. In various embodiments, the phosphor may include or be formed from an oxidic or (oxy)nitridic phosphor, such as a garnet, orthosilicate, nitrido(alumo)silicate, nitride or nitridoorthosilicate, or a halide or halophosphate, for example $Ce^{3+}$ doped garnet such as YAG:Ce and LuAG, for example $(Y, Lu)_3(Al,Ga)_5O_{12}:Ce^{3+}$; $Eu^{2+}$ doped nitrides, for example $CaAlSiN_3:Eu^{2+}$, $(Ba,Sr)_2Si_5N_8:Eu^{2+}$; $Eu^{2+}$ doped sulfides, SiONs, SiAlON, orthosilicates, for example $(Ba,Sr)_2SiO_4:Eu^{2+}$; chlorosilicates, chlorophosphates and/or BAM (barium magnesium aluminate: Eu). Concrete examples of suitable phosphors are strontium chloroapatite:Eu $((Sr,Ca)_5(PO_4)_3Cl:Eu;$ SCAP), yttrium aluminum garnet:cerium (YAG:Ce) or $CaAlSiN_3:Eu$. Furthermore, the phosphor or phosphor mixture can contain for example particles having light-scattering properties and/or auxiliaries. Examples of auxiliaries include surfactants and organic solvents. Examples of light-scattering particles are gold, silver and metal oxide particles.

The organic constituents of the lighting device, for example an organic light emitting diode (OLED), are often susceptible with regard to UV radiation (electromagnetic radiation having a wavelength of below approximately 400 nm) of daylight, since this radiation can lead to aging or degradation of the organic constituents, for example by means of breaking chemical bonds e.g. of C—O—H at 270-290 kJ/mol ($E_{380nm-400nm}$ approximately 290-305 kJ/mol) and/or crosslinking. In various embodiments, the optically functional structure can therefore be formed as UV filter, for example include a UV-absorbing substance. As a result, the organic functional layer structure can be protected against UV radiation.

A UV-absorbing substance can reduce the transmission for electromagnetic radiation having a wavelength of less than approximately 400 nm at least in one wavelength range. The lower UV transmission can be formed for example by means of a higher absorption and/or reflection and/or scattering of UV radiation by means of the UV-absorbing additive. In various embodiments, a UV-absorbing substance may include or be formed from a substance, a substance mixture or a stoichiometric compound from the group of the substances: $TiO_2$, $CeO_2$, $Bi_2O_3$, ZnO, $SnO_2$, a phosphor, UV-absorbing glass particles and/or suitable UV-absorbing metallic nanoparticles, wherein the phosphor, the glass particles and/or the nanoparticles have an absorption of electromagnetic radiation in the UV range. In various configurations, the UV-absorbing nanoparticles may for example have no or a low solubility in a molten matrix and/or not react, or react only poorly, therewith. In various configurations, the nanoparticles may lead to no or only to a slight scattering of electromagnetic radiation, for example nanoparticles having a grain size of less than approximately 50 nm, for example composed of $TiO_2$, $CeO_2$, ZnO or $Bi_2O_3$.

In various embodiments, an optically functional structure on a substrate, for example a carrier having electrical busbars, as planarization layer or planarization structure with respect to the substrate without an optically functional structure, reduces the roughness of the exposed surface with busbars. The roughness of the exposed surface with an optically functional structure can be for example less than 0.25 µm, for example less than 0.2 µm, for example less than 0.125 µm, for example less than 0.1 µm, for example less than 0.075 µm, for example less than 0.05 µm, for example less than 0.04 µm, for example less than 0.03 µm, for example less than 0.02 µm, for example less than 0.01 µm, for example less than 0.005 µm.

In various embodiments, a lighting device 100 includes an electrically active region 106 on or above a substrate 130, for example illustrated in FIG. 1.

The electrically active region 106 is formed for converting an electric current into an electromagnetic radiation, as described more thoroughly below, for example.

The substrate 130 includes a carrier 102. The carrier 102 may include or be formed from glass, quartz and/or a semiconductor material. Furthermore, the carrier may include or be formed from a plastics film or a laminate including one or including a plurality of plastics films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN).

The carrier 102 may include or be formed from a metal, for example copper, silver, gold, platinum, iron, for example a metal compound, for example steel.

The carrier 102 can be embodied as opaque, translucent or even transparent.

In various embodiments, the carrier 102 is formed as transparent or translucent with respect to at least part of the electromagnetic radiation, for example in the visible wavelength range.

The carrier 102 can be a part of a mirror structure or form the latter.

The carrier 102 can have a mechanically rigid region and/or a mechanically flexible region or be formed in this way, for example as a film.

The carrier 102 can be formed as a waveguide for the electromagnetic radiation, for example can be transparent or translucent with respect to the emitted electromagnetic radiation of the lighting device 100.

A current distribution structure 110 is formed on or above the carrier 102. The current distribution structure 110 includes at least one electrical busbar 108.

In various embodiments, an electrical busbar 108 includes two or more lines 108-*n* arranged parallel to one another, for example a first electrical line 108-1, a second electrical line 108-2 and a third electrical line 108-3.

Alternatively or additionally, the current distribution structure 110 on or above the carrier 102 may include two or more electrical busbars 108-*n*, for example a first electrical busbar 108-1, a second electrical busbar 108-2 and a third electrical busbar 108-3.

In the case of the electrical line 108-*n* and the electrical busbar 108-*n*, n is a natural number and identifies the respective electrical busbar or electrical line of an electrical busbar. The embodiments of the substrate 130 described below are illustrated on the basis of a substrate 130 having a first electrical busbar 108-1 and a second electrical busbar 108-2. In the respective embodiments, the first electrical busbar 108-1 and the second electrical busbar 108-2 can alternatively or additionally be or include a first electrical line 108-1 and a second electrical line 108-2 of an individual electrical busbar in such a way and insofar as this is meaningful in each case with regard to the application of the substrate 130, for example in such a way that an electrical short circuit of an anode and a cathode of the lighting device is avoided.

In other words: in various embodiments, the first electrical busbar 108-1 and the second electrical busbar 108-2 can be part of a current distribution structure 110. In other words: in various embodiments the substrate 130 includes a current distribution structure 110, wherein the current distribution structure 110 includes at least one electrical busbar 108. The first electrical busbar 108-1 and the second electrical busbar 108-2 can be different electrical busbars that are electrically connected to one another or insulated from one another; or different regions of an individual electrical busbar, for example in the form of electrical lines. In various embodiments, the electrical current distribution structure 110 includes two or more electrical busbars, wherein the plurality of electrical busbars have an arrangement in a lattice or net structure or in the form of parallel tracks. The lattice or net structure can be formed for example areally on the carrier 102.

The first electrical busbar 108-1 and the second electrical busbar 108-2 can have a width 112, a height 116 and a distance 114. The first electrical busbar 108-1 is formed at a distance 114 from the second electrical busbar 108-2. The first electrical busbar 108-1 is formed alongside the second electrical busbar 108-2 on or above the carrier 102, for example laterally alongside.

The first electrical busbar 108-1 and the second electrical busbar 108-2 can have an identical or different width or height relative to one another. Furthermore, the distance between the first electrical busbar 108-1 and the second electrical busbar 108-2 can be identical to or different than the distance between the second electrical busbar 108-2 and the third electrical busbar 108-3.

An electrical busbar 108 may include or be formed from, for example, nanowires or a metal or metal alloy, for example silver, copper, gold, aluminum and/or other metals; carbon nanotubes, for example as single wall or multiwall carbon nanotubes; and/or an electrically conductive and/or electrically conducting metal oxide, for example indium tin oxide, indium zinc oxide, zinc oxide, nickel oxide or the like. The electrical busbar can be formed for example as at least translucent, for example transparent; and/or such that it is not visible or is hardly visible. By way of example, the electrical busbar can have a high aspect ratio (ratio of the height to the width), for example in a range of 1:10 to 10:1 or higher, for example higher than 1:10, for example higher than 1:1, for example higher than 10:1, for example higher than 15:1 or more.

The resolving power of the human eye is in the region of 50 µm. A non-visible structure width, i.e. a structure width not resolvable by the human eye, of the electrical busbar 108 is for example less than the resolving power of the observer, for example less than approximately 50 µm. By way of example, it is possible to form a non-visible structure width of a busbar with a minimum structure width of 10 µm, for example, by means of an inkjet printing method.

In other words: the first electrical busbar 108-1 and/or the second electrical busbar 108-2 can be formed in such a way that they have a ratio of height 116 to width 112 of greater than 1 to 10, for example by the first electrical busbar 108-1 and/or the second electrical busbar 108-2 being formed as a layer stack. An electrical busbar 108 can have for example one or more edge lengths 112, 116 with respect to the cross-sectional area of the line be greater than 0.1 µm², for example be greater than 1 µm², be greater than 10 µm², be greater than 100 µm², for example be greater than 1000 µm², for example in a range of approximately 0.1 µm² to approximately 100 µm². The width 112 of the electrical busbar 108 can be dependent on the thickness 116 of the busbar 108 in each case with respect to the surface normal of the carrier 102 parallel to the surface normal of the electrically active region 106; and the material composition of the busbar(s) 108, for example the electrical conductivity thereof. The electrical busbar 108 can have for example a rectangular, square, triangular, trapezoidal or lenticular cross-sectional area.

In various embodiments, at least one electrical busbar 108 is arranged or formed areally on the carrier 102, for example with parallel tracks or lines, for example in the form of a meander or a spiral. As a result, a current distribution can be made possible by means of a single electrical busbar over a large area of an electrode.

The current distribution structure 110 or the first electrical busbar 108-1 and/or the second electrical busbar can be formed in such a way as to have a higher electrical transverse conductivity with respect to the areal extent than the electrically active region 106, for example than the first electrode 410 and/or the second electrode 414, as will be described even more thoroughly below, for example.

An optically functional structure 104 is formed between the first electrical busbar 108-1 and the second electrical busbar 108-2. The optically functional structure 104 is formed in such a way that the beam path of the electromagnetic radiation through the substrate 130 and/or the spectrum of the electromagnetic radiation are/is variable.

In various embodiments, the optically functional structure 104 is a part of the current distribution structure 110 for example by virtue of the optically functional structure 104 being formed to electrically insulate the first electrical busbar 108-1 from the second electrical busbar 108-2. Alternatively or additionally, the optically functional structure 104 may include or be formed from an electrically conductive substance and be electrically coupled to the first electrical busbar and/or the second electrical busbar.

The current distribution structure 110 or the current distribution structure 110 together with the optically functional structure 104 include(s) a surface 118. In various embodiments, the electrically active region 106 is formed on or above the surface 118.

Figure 5A:
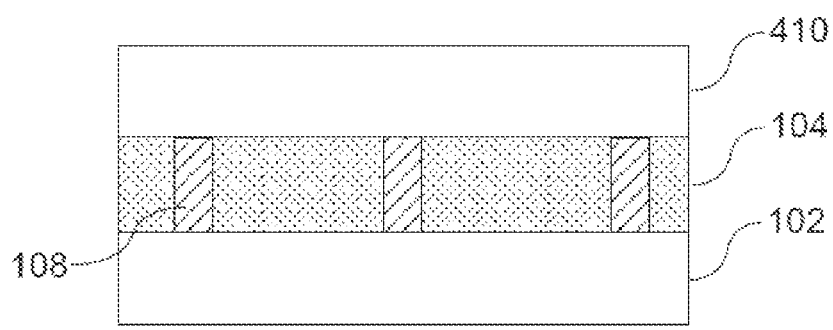
FIGS. 5A-5D show schematic illustrations of various embodiments of a region of a lighting device.
Figure 5B:
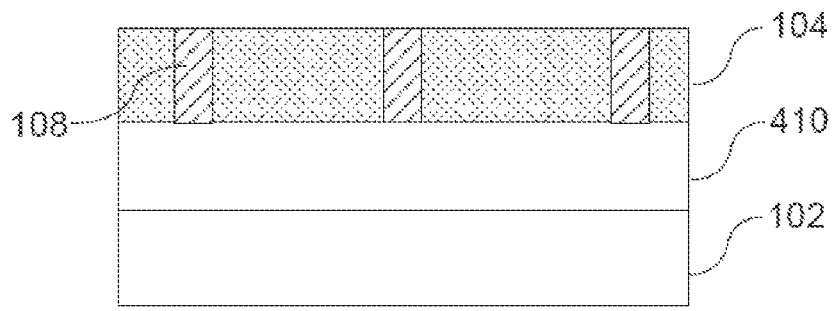
Figure 5C:
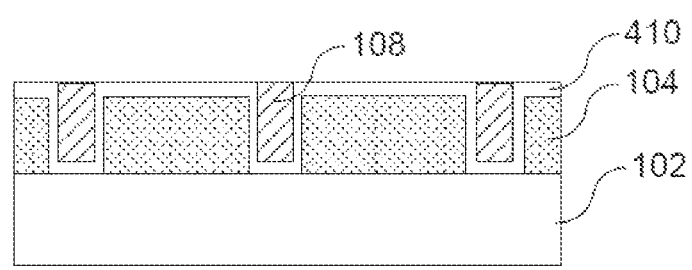
Figure 5D:
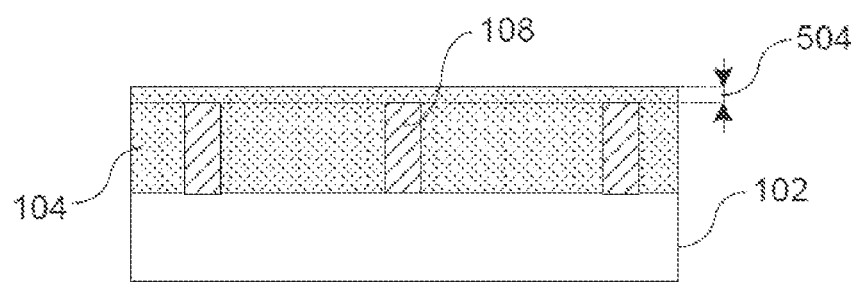
Figure 6:
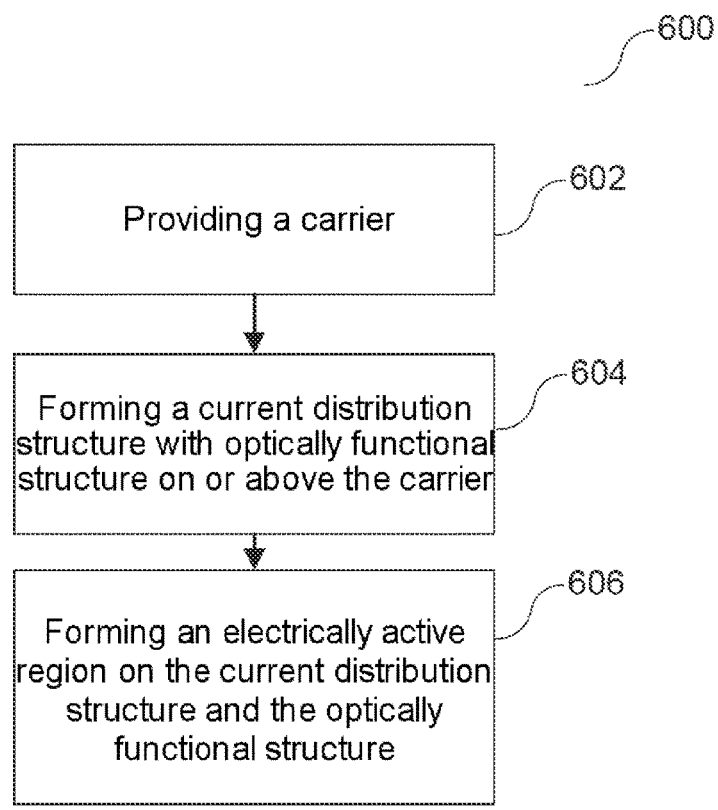
FIG. 6 shows a schematic illustration of a method for producing a lighting device in accordance with various embodiments.

The optically functional structure 104 can at least partly or completely fill, for example overfill, the region between the first electrical busbar 108-1 and the second electrical busbar 108-2 in various embodiments, for example illustrated in FIG. 5D. In other words: in various embodiments, the optically functional structure 104 is formed at least partly laterally between the first electrical busbar 108-1 and the second electrical busbar 108-2.

In various embodiments, the optically functional structure 104 is formed in such a way that the region between the first electrical busbar 108-1 and the second electrical busbar 108-2 is filled in such a way that the first electrical busbar 108-1, the optically functional structure 104 and the second electrical busbar 108-2 include a substantially planar surface 118. As a result, the electrically active region 106 can be formed on a substantially planar surface 118, as a result of which the electrically active region 106 can have a high stability and/or homogeneity.

In various embodiments, the optically functional structure 104 includes or is formed from a dielectric substance.

In various embodiments, the optically functional structure 104 includes or is formed from an electrically conductive substance.

In one embodiment, the electrically conductive optically functional structure 104 may include or be formed from one of the following substances: a metal oxide, a metal nitride, and/or a metal oxynitride, for example a substance of a barrier layer of the lighting device, for example can be formed as a barrier layer of the lighting device, as described thoroughly below.

In one embodiment, the electrically conductive optically functional structure 104 may include at least one layer having a layer thickness in a range of approximately 0.1 nm to approximately 10 µm, for example in a range of approximately 30 nm to approximately 50 nm.

In one embodiment, the electrically conductive optically functional structure 104 may include or be formed from a dopant in a matrix 202. The matrix 202 of the electrically conductive optically functional structure 104 may include or be formed from, for example, a transparent conductive oxide, for example zinc oxide, tin oxide, nickel oxide, and/or a copper delafossite. The dopant of the electrically conductive optically functional structure 104 may include or be for example a metal, for example silver, copper, gold, aluminum, zinc, tin. In one embodiment, the electrically conductive optically functional structure 104 may include or be formed from zinc oxide doped with aluminum. In one embodiment, the electrically conductive optically functional structure 104 may include or be formed from an alloy.

In one embodiment, the electrically conductive substance of the electrically conductive optically functional structure 104 may include electrically conductive particles 204 in one of the following forms: nanowires, nanotubes, flakes or laminae. The electrically conductive particles 204 can have an average diameter in a range of approximately 5 nm to approximately 1 µm, for example of approximately 10 nm to approximately 150 nm, for example of approximately 15 nm to approximately 60 nm, and/or a length in a range of from the diameter of the corresponding nanowire to approximately 1 mm, for example of approximately 1 µm to approximately 100 µm, for example of approximately 20 µm to approximately 50 µm. Alternatively or additionally, the electrically conductive optically functional structure 104 may include an electrically conductive substance in the form of a graphene area. Alternatively or additionally, the electrically conductive optically functional structure 104 may include or be formed from one of the following substances: carbon, silver, copper, gold, aluminum, zinc, tin. Alternatively or additionally, the electrically conductive optically functional structure 104 may include or be formed from nanotubes composed of carbon, for example as single wall nanotubes (SWCNT), multiwall nanotubes (MWCNT), and/or functionalized nanotubes, for example including chemically functional groups on the outer skin of the nanotubes.

In various embodiments, the optically functional structure 104 is formed as or includes an electrical insulation between the first electrical busbar 108-1 and the second electrical busbar 108-2.

In various embodiments, the optically functional structure 104 includes a transparent or translucent substance or is formed therefrom or in this way.

In various embodiments, the optically functional structure 104 is formed laterally between the first electrical busbar 108-1 and the second electrical busbar 108-2. In other words: the optically functional structure 104 can be laterally delimited by the first electrical busbar 108-1 and the second electrical busbar 108-2. In other words: the first electrical busbar 108-1 and the second electrical busbar 108-2 can be embedded in the optically functional structure.

In various embodiments, the optically functional structure 104 is formed in such a way that the first electrical busbar 108-1 and the second electrical busbar 108-2 are exposed, for example in such a way that they are electrically contactable.

In various embodiments, the optically functional structure 104 is formed in such a way that the optically functional structure 104 overfills the first electrical busbar 108-1 and/or the second electrical busbar 108-2. The overfilled part of the optically functional structure 104 may include or form for example a substantially smooth surface, for example at least in the region of the overfilled busbar.

The optically functional structure 104 is formed in such a way that it reduces the roughness of the exposed surface 118 of the substrate 130, for example planarizes the surface.

In various embodiments, the substrate 130 includes an electrical insulation between the optically functional structure 104 and the first electrical busbar 108-1 and/or the second electrical busbar 108-2. The electrical insulation can be formed in such a way that the optically functional structure 104 is electrically insulated at least from one of the electrical busbars.

In various embodiments, the optically functional structure 104 is formed as a coupling structure with respect to the electromagnetic radiation, for example as a coupling-in structure or extraction structure, for example in the visible wavelength range.

In various embodiments, the optically functional structure 104 is formed with respect to the refractive index of the carrier 102 and/or the refractive index of the optically active layer that can be formed above the optically functional structure 104 in such a way that proportion of the electromagnetic radiation which is transmittable through the substrate 130 is greater than in the case of a substrate 130 for the optically active region 106 without an optically functional structure 104.

In various embodiments, the optically functional structure 104 includes at least one region which is formed as a waveguide for at least part of the electromagnetic radiation, for example with respect to a wavelength range and/or a polarization direction, for example in the visible wavelength range, for example for unpolarized light.

In various embodiments, the optically functional structure 104 is formed as the core of a waveguide for the electromagnetic radiation and the first electrical busbar 108-1 and the second electrical busbar are formed as the cladding of the waveguide.

In various embodiments, the optically functional structure 104 with the electrical busbars 108-n is formed or acts as an optical lens for the incident electromagnetic radiation. The electromagnetic radiation can thereby be for example focusable, collimatable or expandable.

In various embodiments, the optically functional structure 104 is formed as a filter structure of the electromagnetic radiation, for example with respect to at least one wavelength range and/or a polarization direction, for example as a bandpass, long-pass, short-pass or cut-off filter, for example with respect to UV radiation and/or infrared radiation.

In various embodiments, the optically functional structure 104 is formed as an antireflection coating, for example with respect to at least one wavelength range of the electromagnetic radiation, for example in the visible wavelength range.

In various embodiments, the optically functional structure 104 is formed as a wavelength-converting structure. The wavelength-converting structure includes a colorant or phosphor, for example.

Figure 4:
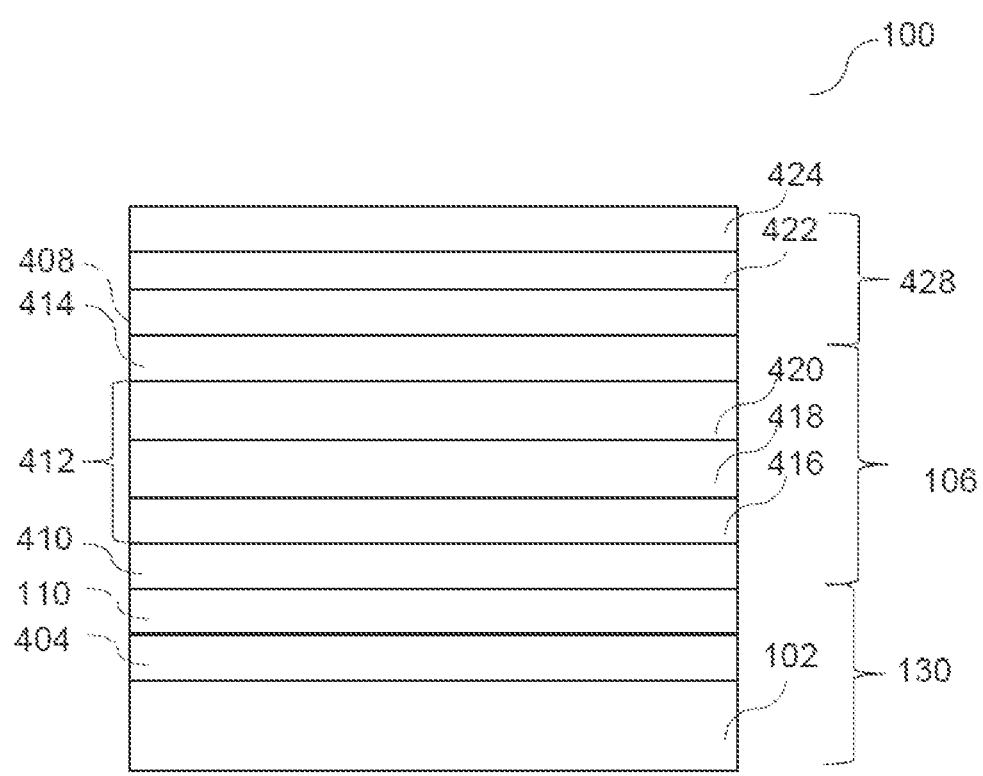
FIG. 4 shows a schematic illustration of a region of a lighting device in accordance with various embodiments.

In various embodiments, a first barrier layer is formed between the carrier 102, the current distribution structure 110 and/or the optically functional structure 104, for example in order to hermetically seal the carrier 102, for example with respect to water and/or oxygen, for example illustrated in FIG. 4 and the associated description. Alternatively or additionally, a barrier layer can be formed on the surface 118, for example between the current distribution structure 110, the optically functional structure 104 and the electrically active region. Said barrier layer can for example be formed in an electrically conductive fashion and/or include electrical through contacts. Alternatively or additionally, said barrier layer can be formed as a planarization layer of the current distribution structure 110 and/or optically functional structure 104, for example illustrated in FIG. 5D.

In various embodiments, the optically functional structure 104 has a substantially homogeneous cross section, for example illustrated in FIG. 1.

Figure 2:
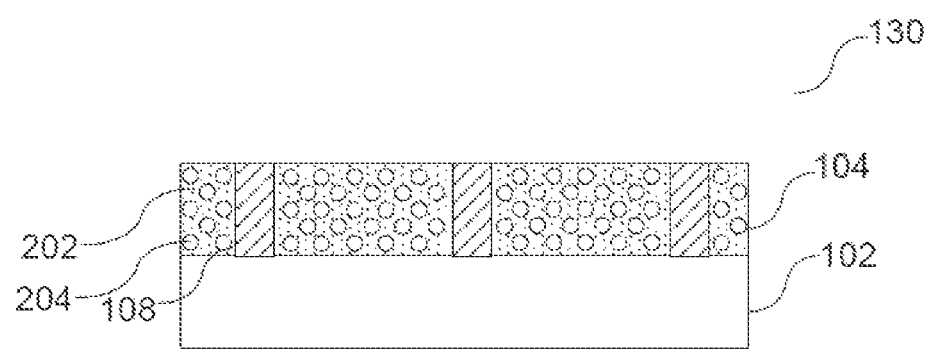
FIG. 2 shows a schematic illustration of a region of a lighting device in accordance with various embodiments.
Figure 3:
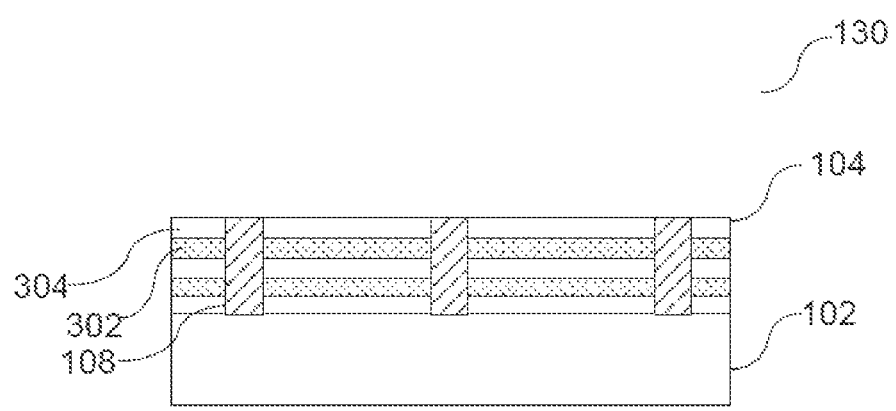
FIG. 3 shows a schematic illustration of a region of a lighting device in accordance with various embodiments.

In various embodiments, the optically functional structure 104 includes a matrix 202, in which particles 204 are distributed, for example illustrated in FIG. 2.

The particles 204 can be formed such that they are non-scattering with respect to visible light.

Alternatively or additionally, the optically functional structure 104 may include particles 204 formed such that they are scattering with regard to visible light.

The matrix 202 can be formed for example in an amorphous fashion, for example as a glass. The matrix 202 may include or be formed from a molding material and/or a potting material.

In various embodiments, the matrix 202 includes or is formed from at least one substance or one substance mixture from one of the following glass systems: PbO-containing systems, for example $PbO-B_2O_3$, $PbO-SiO_2$, $PbO-B_2O_3-SiO_2$, $PbO-B_2O_3-ZnO_2$, $PbO-B_2O_3-Al_2O_3$; and/or $Bi_2O_3$-containing systems, for example $Bi_2O_3-B_2O_3$, $Bi_2O_3-B_2O_3-SiO_2$, $Bi_2O_3-B_2O_3-ZnO$, $Bi_2O_3-B_2O_3-ZnO-SiO_2$. Alternatively or additionally, the matrix 202 may include or be formed from a substance or a substance mixture from one of the following substances: $Al_2O_3$, alkaline earth metal oxides, alkali metal oxides, $ZrO_2$, $TiO_2$, $HfO_2$, $Nb_2O_5$, $Ta_2O_5$, $TeO_2$, $WO_3$, $MO_3$, $Sb_2O_3$, $Ag_2O$, $SnO_2$, rare earth oxides; Ce, Fe, Sn, Ti, Pr, Eu and/or V compounds.

The substance or the substance mixture of the matrix 202 should be liquefiable at a temperature that is lower than the melting point or softening temperature of the carrier 102, for example liquefiable up to a maximum of approximately 600° C.

In various embodiments, the matrix 202 includes or is formed from at least one of the following substances: a silicone, for example a polydimethylsiloxane, polydimethylsiloxane/polydiphenylsiloxane and/or a derivative thereof; a silazane, an epoxy, a polyacrylate, a polycarbonate or the like, for example a silicone hybrid, a silicone-epoxy hybrid.

The particles 204 may include or be formed from an inorganic substance or an inorganic substance mixture. By way of example, the particles 204 may include or be formed from a substance, a substance mixture or a stoichiometric compound composed of/including one of the following substances: $TiO_2$, $CeO_2$, $Bi_2O_3$, ZnO, $SnO_2$, $Al_2O_3$, $SiO_2$, $Y_2O_3$, $ZrO_2$, phosphors, colorants, and glass particles 204, metallic nanoparticles.

Alternatively or additionally, the particles 204 can have cavities.

The particles 204 can have a curved surface, for example in a manner similar or identical to an optical lens. By way of example, the particles 204 can have one of the following geometrical shapes and/or a part of one of the following geometrical shapes: spherical, aspherical, for example prismatic, ellipsoid, hollow, laminar or rod-shaped.

The particles 204 can have an average diameter in a range of approximately 0.01 μm to approximately 10 μm, for example in a range of approximately 0.1 μm to approximately 5 μm. Particles 204 that are non-scattering in the visible wavelength range can have for example an average diameter in a range of 10 nm to 100 nm. Particles 204 that are scattering in the visible wavelength range can have for example an average diameter in a range of 100 nm to 5 μm, depending on the wavelength and the angle of incidence.

The particles 204 can be distributed in the matrix 202 in such a way that the optically functional structure 104 in the visible wavelength range of the electromagnetic radiation has a layer-thickness-averaged refractive index difference with respect to the carrier 102 that is greater than 0.05. In the case of a layer thickness averaging, the refractive indices of the individual constituents are multiplied by their respective proportion by volume in the structure and these mathematical products are summed for the respective different constituents of the structure. The different constituents may be for example particles and matrix and/or two or more layers having different constitutions.

In various embodiments, the particles 204 can have a refractive index that is less than 1.4 or greater than 1.6 in the visible wavelength range of the electromagnetic radiation.

In various embodiments, the particles 204 may include or be formed from a material that at least partly absorbs the electromagnetic radiation, for example a wavelength-converting material, for example a phosphor or colorant.

In various embodiments, the particles 204 can be UV-absorbing or be formed as UV-absorbing.

In various embodiments, the optically functional structure 104 includes at least one first layer 302 and one second layer 304, wherein the first layer 302 and the second layer 304 can be formed identically or differently. For the case where the first layer 302 is identical to the second layer 304, it is possible to form an interface between the first layer 302 and the second layer 304. A first layer 302 and a second layer 304 can be formed from the same substance and by the same method, for example in order to increase the aspect ratio of the first electrical busbar 108-1 and the second electrical busbar 108-2. By way of example, the first electrical busbar 108-1, the second electrical busbar 108-2 and the optically functional structure 104 with first layer 302 and second layer 304 can be formed in plies. As a result, a layer stack can be formed, for example for the case where an interface is formed between the first layer 302 and the second layer 304.

By way of example, firstly the first layer 302 can be formed. The first layer 302 can for example be formed in a structured fashion or be structured after being formed in such a way that regions for the electrical busbars 108-n are formed. In these regions, the electrical busbar 108-n can in each case be formed in a coplanar manner with respect to the first layer 302, for example by means of evaporation or blade coating. Afterward, the second layer 304 can be formed on the first layer 302, for example in a structured fashion, or can be structured after the formation of the second layer 304 in such a way that regions for the electrical busbars are formed above the regions of the first layer 302. Afterward, in a manner analogous to that in the case of the first layer, the electrical busbars 108-n can be formed in the structured regions in the second layer 304. Afterward, a third layer or a first layer 302 can be formed on the second layer 304. The procedure as described above can be repeated until a predefined aspect ratio and/or a predefined cross-sectional area for the electrical busbars are/is formed. As a result, as the number of plies of the first layer 302 and the second layer 304 increases, the aspect ratio can be increased ply by ply.

In one embodiment, the optically functional structure 104 having a plurality of layers 302, 304 can be formed as a mirror structure, for example as a photonic crystal.

In various embodiments, a lighting device 100 is provided which includes a substrate 130 described above, for example illustrated in the schematic excerpt from a lighting device in FIG. 4.

The lighting device 100 may include the substrate 130, the active region 106 and an encapsulation structure 428.

The substrate 130 can be formed for example as a hermetically impermeable substrate 130, for example by virtue of the carrier being formed in a hermetically impermeable fashion and/or the hermetically impermeable substrate including a barrier layer 404.

A hermetically impermeable structure can be hermetically impermeable for example with regard to an environmental influence that is harmful to the active region 106, for example with regard to an electromagnetic radiation and/or harmful substance, for example a solvent or chemically reactive substance, for example water and/or oxygen. A hermetically impermeable structure can have for example a diffusion rate with respect to a harmful substance of less than approximately $10^{-1}$ g/(m² d), for example of less than approximately $10^{-4}$ g/(m² d), for example in a range of approximately $10^{-4}$ g/(m² d) to approximately $10^{-10}$ g/(m² d), for example in a range of approximately $10^{-4}$ g/(m² d) to approximately $10^{-6}$ g/(m² d). A structure that is hermetically impermeable with respect to a radiation can have a transmission of the radiation of less than 10%, for example less than 5%, for example less than 1%.

The first barrier layer 404 may include or be formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof.

The first barrier layer 404 can be formed by means of one of the following methods: an atomic layer deposition (ALD) method, for example a plasma enhanced atomic layer deposition (PEALD) method or a plasmaless atomic layer deposition (PLALD) method; a chemical vapor deposition (CVD) method, for example a plasma enhanced chemical vapor deposition (PECVD) method or a plasmaless chemical vapor deposition (PLCVD) method; or alternatively by means of other suitable deposition methods.

In the case of a first barrier layer 404 including a plurality of partial layers, all the partial layers can be formed by means of an atomic layer deposition method. A layer sequence including only ALD layers can also be designated as a "nanolaminate".

In the case of a first barrier layer 404 including a plurality of partial layers, one or a plurality of partial layers of the first barrier layer 404 can be deposited by means of a different deposition method than an atomic layer deposition method, for example by means of a vapor deposition method.

The first barrier layer 404 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

The first barrier layer 404 may include one or a plurality of high refractive index materials, for example one or a plurality of material(s) having a high refractive index, for example having a refractive index of at least 2.

Furthermore, it should be pointed out that, in various embodiments, a first barrier layer 404 can also be entirely dispensed with, for example for the case where the carrier 102 is formed in a hermetically impermeable fashion, for example includes or is formed from glass, metal, metal oxide.

The electrically active region 106 may include a first electrode 410, a second electrode 414 and an organic functional layer structure 412 between the first electrode 410 and the second electrode 414. The organic functional layer structure 412 is formed for converting an electric current into the incident electromagnetic radiation and/or for converting the radiation into an electric current. In various embodiments, the first electrode 410 can be optional, for example by virtue of the substrate 130 including or acting as the first electrode 410.

The electrically active region 106 can be or include for example the optically active region 106 of the lighting device 100. The electrically active region 106 is for example that region of the lighting device 100 in which electric current for the operation of the lighting device 100 flows and/or in which electromagnetic radiation is generated and/or absorbed.

The first electrode 404 can be formed as an anode or as a cathode.

The first electrode 410 may include or be formed from one of the following electrically conductive materials: a metal; a transparent conductive oxide (TCO); a network composed of metallic nanowires and nanoparticles, for example composed of Ag, which are combined with conductive polymers, for example; a network composed of carbon nanotubes which are combined with conductive polymers, for example; graphene particles and graphene layers; a network composed of semiconducting nanowires; an electrically conductive polymer; a transition metal oxide; and/or the composites thereof. The first electrode 410 composed of a metal or including a metal may include or be formed from one of the following materials: Ag, Pt, Au, Mg, Al, Ba, In, Ca, Sm or Li, and compounds, combinations or alloys of these materials. The first electrode 410 may include as transparent conductive oxide one of the following materials: for example metal oxides: for example zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped or be hole-conducting (p-TCO), or electron-conducting (n-TCO).

The first electrode 410 may include a layer or a layer stack of a plurality of layers of the same material or different materials. The first electrode 410 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode 404 can have for example a layer thickness in a range of 10 nm to 500 nm, for example of less than 25 nm to 250 nm, for example of 50 nm to 100 nm.

The first electrode 410 can have a first electrical terminal, to which a first electrical potential can be applied. The first electrical potential can be provided by an energy source, for example a current source or a voltage source. Alternatively, the first electrical potential can be applied to an electrically conductive carrier 102 and the first electrode 410 can be electrically supplied indirectly through the carrier 102. The first electrical potential can be for example the ground potential or some other predefined reference potential.

The organic functional layer structure 412 may include one, two or more functional layer structure units and one, two or more intermediate layer structure(s) between the layer structure units, for example 3, 4, 5, 6, 7, 8, 9, 10, or even more, for example 15 or more, for example 70. The organic functional layer structure 412 may include for example a first organic functional layer structure unit 416, an intermediate layer structure 418 and a second organic functional layer structure unit 420.

The first organic functional layer structure unit 416 and the optionally further organic functional layer structures can be formed identically or differently, for example include an identical or different emitter material. The second organic functional layer structure unit 420, or the further organic functional layer structure units can be formed like one of the below-described configurations of the first organic functional layer structure unit 416.

The first organic functional layer structure unit 416 may include a hole injection layer, a hole transport layer, an emitter layer, an electron transport layer and an electron injection layer.

In an organic functional layer structure unit 412, one or a plurality of the layers mentioned can be provided, wherein identical layers can have a physical contact, can be only electrically connected to one another or can even be formed in a manner electrically insulated from one another, for example can be formed alongside one another. Individual layers of the layers mentioned can be optional.

A hole injection layer can be formed on or above the first electrode 410. The hole injection layer may include or be formed from one or a plurality of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB (N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis-(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-ylamino)phenyl]-9H-fluorene; 9,9-bis[4-(N,N-bis-naphthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl)benzidine; 2,7-bis[N,N-bis(9,9-spirobifluoren-2-yl)amino]-9,9-spirobifluorene; 2,2'-bis[N,N-bis(biphenyl-4-yl)amino]-

9,9-spirobifluorene; 2,2'-bis(N,N-diphenylamino)-9,9-spirobifluorene; di[4-(N,N-di-tolylamino)phenyl]cyclohexane; 2,2',7,7'-tetra(N,N-di-tolyl)aminospirobifluorene; and/or N,N,N',N'-tetranaphthalen-2-ylbenzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

A hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB (N,N'-bis(naphthalen-2-yl)-N,N'-bis(phenyl)-benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-ylamino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl) benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-ditolyl-amino)phenyl]cyclohexane; 2,2',7,7'-tetra(N,N-ditolyl) aminospirobifluorene; and N,N,N',N'-tetranaphthalen-2-ylbenzidine, a tertiary amine, a carbazole derivative, a conductive polyaniline and/or polyethylene dioxythiophene.

The hole transport layer can have a layer thickness in a range of approximately 5 nm to approximately 50 nm, for example in a range of approximately 10 nm to approximately 30 nm, for example approximately 20 nm.

An emitter layer can be formed on or above the hole transport layer. Each of the organic functional layer structure units 416, 420 may include in each case one or a plurality of emitter layers, for example including fluorescent and/or phosphorescent emitters.

An emitter layer may include or be formed from organic polymers, organic oligomers, organic monomers, organic small, non-polymeric molecules ("small molecules") or a combination of these materials.

The lighting device 100 may include or be formed from one or a plurality of the following materials in an emitter layer: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl) phenyl(2-carboxypyridyl)iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters.

Such non-polymeric emitters can be deposited for example by means of thermal evaporation. Furthermore, polymer emitters can be used which can be deposited for example by means of a wet-chemical method, such as, for example, a spin-coating method.

The emitter materials can be embedded in a suitable manner in a matrix material, for example a technical ceramic or a polymer, for example an epoxy; or a silicone.

In various embodiments, the emitter layer has a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By means of mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure unit 416 may include one or a plurality of emitter layers embodied as hole transport layer.

Furthermore, the organic functional layer structure unit 416 may include one or a plurality of emitter layers embodied as electron transport layer.

An electron transport layer can be formed, for example deposited, on or above the emitter layer.

The electron transport layer may include or be formed from one or a plurality of the following materials: NET-18; 2,2',2''-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium; 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris (2,4,6-trimethyl-3-(pyridin-3-yl)phenyl)borane; 1-methyl-2-(4-(naphthalen-2-yl)phenyl)-1H-imidazo[4,5-f] [1,10] phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

An electron injection layer can be formed on or above the electron transport layer. The electron injection layer may include or be formed from one or a plurality of the following materials: NDN-26, MgAg, Cs$_2$CO$_3$, Cs$_3$PO$_4$, Na, Ca, K, Mg, Cs, Li, LiF; 2,2',2''-(1,3,5-benzinetriyl)tris(1-phenyl-1-

H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridin-6-yl)-1,3,4-oxadiazo-5-yl)benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl] benzene; 2-(naphthalen-2-yl)-4,7-diphenyl-1,10-phenanthroline; 2,9-bis(naphthalen-2-yl)-4,7-diphenyl-1, 10-phenanthroline; tris(2,4,6-trimethyl-3-(pyridin-3-yl) phenyl)borane; 1-methyl-2-(4-(naphthalen-2-yl)phenyl)-1H-imidazo[4,5-f] [1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure 412 including two or more organic functional layer structure units 416, 420, the second organic functional layer structure unit 420 can be formed above or alongside the first functional layer structure units 416. An intermediate layer structure 418 can be formed electrically between the organic functional layer structure units 416, 420.

In various embodiments, the intermediate layer structure 418 is formed as an intermediate electrode 418, for example in accordance with one of the configurations of the first electrode 410. An intermediate electrode 418 can be electrically connected to an external voltage source. The external voltage source can provide a third electrical potential, for example at the intermediate electrode 418. However, the intermediate electrode 418 can also have no external electrical connection, for example by the intermediate electrode having a floating electrical potential.

In various embodiments, the intermediate layer structure 418 is formed as a charge generating layer structure 418 (charge generation layer CGL). A charge generating layer structure 418 may include one or a plurality of electron-conducting charge generating layer(s) and one or a plurality of hole-conducting charge generating layer(s). The electron-conducting charge generating layer(s) and the hole-conducting charge generating layer(s) can be formed in each case from an intrinsically conductive substance or a dopant in a matrix. The charge generating layer structure 418 should be formed, with respect to the energy levels of the electron-conducting charge generating layer(s) and the hole-conducting charge generating layer(s), in such a way that electron and hole can be separated at the interface between an electron-conducting charge generating layer and a hole-conducting charge generating layer. The charge generating layer structure 418 can furthermore have a diffusion barrier between adjacent layers.

Each organic functional layer structure unit 416, 420 can have for example a layer thickness of a maximum of approximately 3 μm, for example a layer thickness of a maximum of approximately 1 μm, for example a layer thickness of a maximum of approximately 300 nm.

The lighting device 100 can optionally include further organic functional layers, for example arranged on or above the one or the plurality of emitter layers or on or above the electron transport layer(s). The further organic functional layers can be for example internal or external coupling-in/extraction structures that further improve the functionality and thus the efficiency of the lighting device.

The second electrode 414 can be formed on or above the organic functional layer structure 412 or, if appropriate, on or above the one or the plurality of further organic functional layer structures and/or organic functional layers.

The second electrode 414 can be formed in accordance with one of the configurations of the first electrode 410, wherein the first electrode 410 and the second electrode 414 can be formed identically or differently. The second electrode 414 can be formed as an anode, that is to say as a hole-injecting electrode, or as a cathode, that is to say as an electron-injecting electrode.

The second electrode 414 can have a second electrical terminal, to which a second electrical potential can be applied. The second electrical potential can be provided by the same energy source as, or a different energy source than, the first electrical potential and/or the optional third electrical potential. The second electrical potential can be different than the first electrical potential and/or the optionally third electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The encapsulation structure 428 may include a second barrier layer 408, a close connection layer 422 and a cover 424.

The second barrier layer 408 can be formed on the second electrode 414.

The second barrier layer 408 can also be referred to as thin film encapsulation (TFE). The second barrier layer 408 can be formed in accordance with one of the configurations of the first barrier layer 404.

Furthermore, it should be pointed out that, in various embodiments, a second barrier layer 408 can also be entirely dispensed with. In such a configuration, the lighting device 102 may include for example a further encapsulation structure, as a result of which a second barrier layer 408 can become optional, for example a cover 424, for example a cavity glass encapsulation or metallic encapsulation.

Furthermore, in various embodiments, in addition, one or a plurality of coupling-in/extracting layers can also be formed in the lighting device 100, for example an external extracting film on or above the carrier 102 (not illustrated) or an internal extracting layer (not illustrated) in the layer cross section of the lighting device 100. The coupling-in/extracting layer may include a matrix and scattering centers distributed therein, wherein the average refractive index of the coupling-in/extracting layer is greater or less than the average refractive index of the layer from which the electromagnetic radiation is provided. Furthermore, in various embodiments, in addition, one or a plurality of antireflection layers (for example combined with the second barrier layer 408) can be provided in the lighting device 100.

In various embodiments, a close connection layer 422, for example composed of an adhesive or a lacquer, is provided on or above the second barrier layer 408. By means of the close connection layer 422, a cover 424 can be closely connected, for example adhesively bonded, on the second barrier layer 408.

A close connection layer 422 composed of a transparent material may include for example particles which scatter electromagnetic radiation, for example light-scattering particles. As a result, the close connection layer 422 can act as a scattering layer and lead to an improvement in the color angle distortion and the extraction efficiency.

The light-scattering particles provided can be dielectric scattering particles, for example composed of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the close connection layer 422, for example air bubbles, acrylate, or hollow glass beads. Furthermore, by way of example, metallic nanoparticles, metals such as gold, silver, iron nanoparticles, or the like can be provided as light-scattering particles.

The close connection layer 422 can have a layer thickness of greater than 1 µm, for example a layer thickness of a plurality of µm. In various embodiments, the close connection layer 422 includes or is a lamination adhesive.

The close connection layer 422 can be designed in such a way that it includes an adhesive having a refractive index that is less than the refractive index of the cover 424. Such an adhesive can be for example a low refractive index adhesive such as, for example, an acrylate having a refractive index of approximately 1.3. However, the adhesive can also be a high refractive index adhesive which for example includes high refractive index, non-scattering particles and has a layer-thickness-averaged refractive index that approximately corresponds to the average refractive index of the organic functional layer structure 412, for example in a range of approximately 1.7 to approximately 2.0. Furthermore, a plurality of different adhesives can be provided which form an adhesive layer sequence.

In various embodiments, between the second electrode 414 and the close connection layer 422, an electrically insulating layer (not shown) is also applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

In various embodiments, a close connection layer 422 can be optional, for example if the cover 424 is formed directly on the second barrier layer 408, for example a cover 424 composed of glass that is formed by means of plasma spraying.

Furthermore, a so-called getter layer or getter structure, for example a laterally structured getter layer, can be arranged (not illustrated) on or above the electrically active region 106.

The getter layer may include or be formed from a material that absorbs and binds substances that are harmful to the electrically active region 106. A getter layer may include or be formed from a zeolite derivative, for example. The getter layer can be formed as translucent, transparent or opaque and/or nontransmissive with respect to the electromagnetic radiation that is emitted and/or absorbed in the optically active region.

The getter layer can have a layer thickness of greater than approximately 1 µm, for example a layer thickness of a plurality of µm.

In various embodiments, the getter layer includes a lamination adhesive or is embedded in the close connection layer 422.

A cover 424 can be formed on or above the close connection layer 422. The cover 424 can be closely connected to the electrically active region 106 by means of the close connection layer 422 and can protect said region from harmful substances. The cover 424 can be for example a glass cover 424, a metal film cover 424 or a sealed plastics film cover 424. The glass cover 424 can be closely connected to the second barrier layer 408 or the electrically active region 106 for example by means of frit bonding (glass frit bonding/glass soldering/seal glass bonding) by means of a conventional glass solder in the geometric edge regions of the lighting device 100.

The cover 424 and/or the close connection layer 422 can have a refractive index (for example at a wavelength of 633 nm) of 1.55.

The lighting device 100 can be formed for example as a surface component. In various embodiments, the lighting device 100 is formed as an organic optoelectronic component 100, for example as a display and/or an organic light emitting diode.

In various embodiments, the first electrical busbar 108-1 is electrically insulated from the second electrical busbar 108-2; and the first electrical busbar 108-1 is electrically coupled to the first electrode 410 and the second electrical busbar 108-2 is electrically coupled to the second electrode 414 of the lighting device. Alternatively, the first electrical busbar 108-1 and the second electrical busbar 108-2 are electrically coupled to the first electrode 410, the second electrode 414 or the intermediate electrode 418.

The current distribution structure 110 for example in the form of the first electrical busbar 108-1 and/or the second electrical busbar 108-2 may include one or more lines extending along the interface of the substrate 130 with the electrically active region 106.

In various embodiments, the current distribution structure 110 includes at least one electrical busbar 108 and electrically conductive through contacts, wherein the through contacts are electrically conductively connected to the at least one electrical busbar 108, in such a way that the at least one electrical busbar 108 is electrically conductively coupled to the active region 106 by means of the through contacts, for example to the first electrode 410 or the second electrode 414 of the lighting device.

In the case of an electrical busbar having a first electrical line 108-1 and a second electrical line 108-2, the lines are in each case electrically coupled to the same electrode, since otherwise a short circuit could be formed.

In one embodiment of the optically functional structure including particles 204 in a matrix 202, the particles 204 can be distributed in the matrix 202 in such a way that the optically functional structure 104 in the visible wavelength range of the electromagnetic radiation has a layer-thickness-averaged refractive index difference with respect to the electrically active region 106, the organic functional layer structure 412 and/or the carrier 102 that is greater than 0.05.

In various embodiments, the first electrode 410 is formed on the surface 118 of the first electrical busbar 108-1, the second electrical busbar 108-2 and/or the optically functional structure 104, for example illustrated in FIG. 5A.

The arrangement of the optically functional structure 104 and one or more electrical busbar(s) 108-n in one plane, for example the surface thereof in one plane, can be formed a planar or plane surface 118, for example as a plane substrate 130 for the further coatings, for example a forming or applying of a first electrode 410, for example an anode 410, composed of a transparent electrically conductive oxide (TCO); an electrically conductive barrier layers, for example by means of atomic layer deposition (ALD); or a charge carrier injection layer (hole injection layer HIL; electron injection layer EIL) composed of/including a highly conductive material or nanowires. Furthermore, the probability of defects in the encapsulation structure 428, for example the second barrier layer 408 (thin film encapsulation), can be reduced since defects often occur in proximity to or at the flanks in the resist above the electrical busbar(s). The electrical busbar(s) 108-$n$, in terms of the structure size thereof, for example width 112, can also have the size of a silver mesh.

In various embodiments, the first electrode 410 is formed on the carrier 102, and the first electrical busbar 108-1, the second electrical busbar 108-2 and further electrical busbars 108-$n$, and also the optically functional structure 104 are formed on the first electrode 410, for example illustrated in FIG. 5B.

In various embodiments, the first electrical busbar 108-1 and the second electrical busbar 108-2 are formed above the carrier 102 on the first electrode 410. Alternatively or additionally, the optically functional structure 104 can be formed above the carrier 102 on the first electrode 410.

This is advantageous, for example, if an electrically conductive optically functional structure 104 is formed. As a result, for example, a layer composed of silver nanowires can be deposited, which layer is structured back by means of a laser. The optically functional structure 104 and the one or the plurality of electrical busbar(s) 108-$n$ can subsequently be printed thereon and/or thereabove. As a result, a structuring of the first electrode 410 can be optional.

In various embodiments, the first electrode 410 is formed between the optically functional structure 104 and the electrical busbars 108-$n$, for example illustrated in FIG. 5C. In various embodiments, the first electrode 410 is formed between the optically functional structure 104 and the first electrical busbar 108-1 and/or the second electrical busbar 108-2. Alternatively or additionally, the first electrode 410 can be formed between the carrier 102 and the first electrical busbar 108-1 and/or the second electrical busbar 108-2.

In various embodiments, the optically functional structure 104 is formed by means of a printing method, for example in a structured fashion. The first electrode 410 can be formed, for example sputtered, on and/or above the optically functional structure 104 and structured regions. The one or the plurality of electrical busbar(s) can then be formed, for example printed into the remaining structured regions of the optically functional structure 104, for example notches. The sputtering can reshape relatively well the structured, for example segmented, optically functional structure 104. As a result, after the formation of the one or the plurality of electrical busbar(s) 108-$n$, a substantially plane surface can be formed. On said plane surface, further layers can be formed, for example be deposited by means of wet processing.

In various embodiments, the optically functional structure 104 is formed between the first electrical busbar 108-1 and the second electrical busbar 108-2 in such a way that it overfills the first electrical busbar 108-1 and the second electrical busbar 108-2, for example illustrated in FIG. 5D. The part of the optically functional structure 104 on or above the first electrical busbar 108-1 and/or the second electrical busbar 108-2 can for example planarize the surface 118, for example at least in the region of the electrical busbars 108-$n$ overfilled by the optically functional structure 104, for example illustrated by means of the region 504 in FIG. 5D.

Alternatively or additionally, the overfilled region 504 can be formed in one piece as a layer of the optically functional structure 104.

In various embodiments, a method 600 for producing a lighting device 100 is provided.

The lighting device 100 can be formed for example as a surface component.

In various embodiments, the lighting device 100 is formed as an organic optoelectronic component 100, for example as a display and/or an organic light emitting diode.

The method for producing 600 the lighting device 100 includes forming a substrate 130. For this purpose, a carrier 102 is provided 602.

The carrier 102 can be formed as transparent or translucent with respect to at least part of the electromagnetic radiation, for example in the visible wavelength range.

A current distribution structure 110 having at least one electrical busbar 108 is formed on or above the carrier 102. By way of example, a first electrical busbar 108-1 and a second electrical busbar 108-2 can be formed on or above the carrier 102. Alternatively or additionally, an electrical busbar having a first electrical line 108-1 and a second electrical line 108-2 can be formed, wherein the first electrical line 108-1 is formed at least in a region parallel to the second electrical line 108-2 and at a distance from the latter.

Furthermore, an optically functional structure 104 is formed on or above the carrier 102. The optically functional structure 104, the first electrical busbar 108-1 and the second electrical busbar 108-2 are formed in such a way that the optically functional structure 104 is formed between the first electrical busbar 108-1 and the second electrical busbar 108-2 on or above the carrier 102.

By way of example, an optically functional structure 104 is formed between a first electrical line 108-1 and a second electrical line 108-2 of the electrical busbar and/or an optically functional structure 104 is formed between a first electrical busbar 108-1 and a second electrical busbar 108-2. In other words: the optically functional structure 104 can be formed between the first electrical busbar 108-1 and the second electrical busbar 108-2.

Alternatively, an optically functional structure 104 can be formed in a structured fashion, and the first electrical line 108-1 and the second electrical line 108-2 of the electrical busbar and/or the first electrical busbar 108-1 and the second electrical busbar 108-2 can be formed on or above the optically functional structure 104 in such a way that at least one part of the optically active structure 104 is formed between the electrical lines 108-1/2 and/or the electrical busbars 108-1/2. In other words: the first electrical busbar 108-1 and the second electrical busbar 108-2 can be formed in the optically functional structure 104 or can be formed in a manner surrounded by the optically functional structure 104.

Furthermore, the optically functional structure 104 is formed in such a way that, with respect to an electromagnetic radiation incident on the optically functional structure 104, for example the electromagnetic radiation emitted by the electrically active region, the beam path through the substrate 130 and/or the spectrum of the electromagnetic radiation are/is variable.

In various embodiments, the optically functional structure 104, the first electrical busbar 108-1 and/or the second electrical busbar 108-2 can be deposited in one or a plurality of plies on or above the carrier 102. A first ply and a second ply formed directly on the first ply can be formed from the same substance or different substances.

The optically functional structure 104 can be formed in such a way that it acts as a supporting structure for forming the first electrical busbar 108-1 and/or the second electrical busbar 108-2, for example laterally enclose or reshape the regions in which the first supporting structure and the second supporting structure are formed.

An electrical busbar 108 can be formed for example from nanowires or a metal or metal alloy, for example including silver, copper, gold, aluminum and/or other metals; carbon nanotubes, for example as single wall or multiwall carbon nanotubes; and/or one or a plurality of electrically conductive and/or electrically conducting metal oxide(s), for example indium tin oxide, indium zinc oxide, zinc oxide, nickel oxide or the like.

The electrical busbar can be formed such that it is for example at least translucent, for example transparent, and/or not visible or partly visible, for example by virtue of the structure widths of the electrical busbar being smaller than the resolving power of the observer, for example smaller than approximately 0.5 µm; or the height of the electrical busbar being small, for example less than 100 nm.

By way of example, the electrical busbar 108 can be formed with a relatively high aspect ratio (ratio of the height to the width), for example of 1:10 or more. In other words: the first electrical busbar 108-1 and/or the second electrical busbar 108-2 can be formed in such a way that they have a ratio of height 116 to width 112 greater than 1 to 10.

An electrical busbar 108 can be formed for example with one or more edge lengths with respect to the cross-sectional area of the line in a range of approximately 0.1 µm to approximately 100 µm. The width 112 of the line can be dependent on the thickness, also designated as the height 116, of the line in each case with respect to the surface normal of the carrier 102 and the material composition of the line(s), for example the electrical conductivity thereof.

In various embodiments, at least one electrical busbar 108 is formed areally on the carrier 102, for example with parallel tracks, also designated as electrical lines; for example in the form of a meander or a spiral. As a result, for example, a current distribution can be made possible by means of a single electrical busbar over the entire area of an electrode.

In various embodiments, the current distribution structure 110 is formed with at least one first electrical busbar 108-1 and one second electrical busbar 108-2 or alternatively with at least one first electrical line 108-1 and one second electrical line 108-2. In other words: in various embodiments, the substrate 130 is formed with a current distribution structure 110 having at least two electrical lines 108 which are parallel to one another in at least one region. The first electrical busbar 108-1 and the second electrical busbar 108-2 can be different electrical busbars which are electrically connected to one another or insulated from one another; or different regions of an individual electrical busbar, for example in the form of electrical lines.

The current distribution structure 110 or the first electrical busbar 108-1 and/or the second electrical busbar can be formed in such a way as to have a higher electrical transverse conductivity with respect to the areal extent than for example the electrically active region, for example than the first electrode 410 and/or the second electrode, which are/is formed on the substrate and electrically coupled to at least one electrical busbar.

In various embodiments, the electrical current distribution structure 110 is formed with two or more electrical busbars 108-n, wherein the plurality of electrical busbars are formed in an arrangement having a lattice or net structure or in the form of parallel tracks. The lattice or net structure can be formed for example areally on the carrier 102.

The first electrical busbar 108-1 is formed or arranged at a distance 114 from the second electrical busbar 108-2. The first electrical busbar 108-1 is formed or arranged alongside the second electrical busbar 108-2 on or above the carrier 102.

In various embodiments, the optically functional structure 104 is formed with or from a dielectric substance.

In various embodiments, the optically functional structure 104 is formed with or from an electrically conductive substance, for example with/from one of the following substances: a metal oxide, a metal nitride, and/or a metal oxynitride, for example a substance of a barrier layer of the lighting device, for example as a barrier layer of the lighting device.

In one embodiment, the electrically conductive optically functional structure 104 can be formed with or from at least one layer having a layer thickness in a range of approximately 0.1 nm to approximately 10 µm, for example with/from a layer having a layer thickness in a range of approximately 30 nm to approximately 50 nm.

In one embodiment, the electrically conductive optically functional structure 104 can be formed with or from a dopant distributed in a matrix 202. The matrix 202 of the electrically conductive optically functional structure 104 may include or be formed from, for example, a transparent conductive oxide, for example zinc oxide, tin oxide, nickel oxide, and/or a copper delafossite. The dopant of the electrically conductive optically functional structure 104 may include or be, for example, a metal, for example silver, copper, gold, aluminum, zinc, tin. In one embodiment, the electrically conductive optically functional structure 104 can be formed with or from aluminum-doped zinc oxide. In one embodiment, the electrically conductive optically functional structure 104 can be formed with or from an alloy.

In one embodiment, the electrically conductive optically functional structure 104 can be formed with or from electrically conductive particles 204 including or composed of at least one electrically conductive substance of the following forms: nanowires, nanotubes, flakes or laminae. The nanotubes composed of carbon can be for example single wall nanotubes (SWCNT), multiwall nanotubes (MWCNT), and/or functionalized nanotubes, for example including chemically functional groups on the outer skin of the nanotubes. The electrically conductive particles 204 can have for example an average diameter in a range of approximately 5 nm to approximately 1 µm, for example of approximately 10 nm to approximately 150 nm, for example of approximately 15 nm to approximately 60 nm, and/or a length in a range of from the diameter of the corresponding nanowire to approximately 1 mm, for example of approximately 1 µm to approximately 100 µm, for example of approximately 20 µm to approximately 50 µm. Alternatively or additionally, the electrically conductive optically functional structure 104 can be formed with or from an electrically conductive substance in the form of a graphene area. Alternatively or additionally, the electrically conductive optically functional structure 104 can be formed from or with one of the following substances: carbon, silver, copper, gold, aluminum, zinc, tin.

In various embodiments, the optically functional structure 104 is formed as or formed with an electrical insulation between the first electrical busbar 108-1 and the second electrical busbar 108-2.

The optically functional structure 104 can be formed from or with a transparent or translucent substance.

In various embodiments, the optically functional structure 104 is formed from or with particles 204 distributed in a matrix 202. The particles 204 can be formed such that they are non-scattering with respect to visible light. Alternatively or additionally, the optically functional structure 104 can be formed from or with particles 204 which are formed such that they are scattering with respect to visible light.

The matrix 202 can be formed for example in an amorphous fashion, for example as a glass. The matrix 202 may include or be formed from a molding material and/or a potting material.

In various embodiments, the matrix 202 is formed from or with at least one substance or substance mixture from one of the following glass systems: PbO-containing systems, for example $PbO—B_2O_3$, $PbO—SiO_2$, $PbO—B_2O_3—SiO_2$, $PbO—B_2O_3—ZnO_2$, $PbO—B_2O_3—Al_2O_3$; and/or $Bi_2O_3$-containing systems, for example $Bi_2O_3—B_2O_3$, $Bi_2O_3—B_2O_3—SiO_2$, $Bi_2O_3—B_2O_3—ZnO$, $Bi_2O_3—B_2O_3—ZnO—SiO_2$. Alternatively or additionally, the matrix 202 may include or be formed from a substance or a substance mixture from one of the following substances: $Al_2O_3$, alkaline earth metal oxides, alkali metal oxides, $ZrO_2$, $TiO_2$, $HfO_2$, $Nb_2O_5$, $Ta_2O_5$, $TeO_2$, $WO_3$, $MO_3$, $Sb_2O_3$, $Ag_2O$, $SnO_2$, rare earth oxides; Ce, Fe, Sn, Ti, Pr, Eu and/or V compounds.

The substance or the substance mixture of the matrix 202 should be liquefiable at a temperature that is lower than the melting point or softening temperature of the carrier 202, for example liquefiable up to a maximum of approximately 600° C.

In various embodiments, the matrix 202 includes or is formed from at least one of the following substances: a silicone, for example a polydimethylsiloxane, polydimethylsiloxane/polydiphenylsiloxane and/or a derivative thereof; a silazane, an epoxy, a polyacrylate, a polycarbonate or the like, for example a silicone hybrid, a silicone-epoxy hybrid.

The particles 204 may include or be formed from an inorganic substance or an inorganic substance mixture. By way of example, the particles 204 may include or be formed from a substance, a substance mixture or a stoichiometric compound composed of/including one of the following substances: $TiO_2$, $CeO_2$, $Bi_2O_3$, $ZnO$, $SnO_2$, $Al_2O_3$, $SiO_2$, $Y_2O_3$, $ZrO_2$, phosphors, colorants, and glass particles 204, metallic nanoparticles 204.

Alternatively or additionally, the particles 204 can be formed from or with cavities.

The particles 204 can have a curved surface or be formed in this way, for example in a manner similar or identical to an optical lens. By way of example, the particles 204 can have one of the following geometrical shapes and/or a part of one of the following geometrical shapes or can be formed in this way: spherical, aspherical, for example prismatic, ellipsoid, hollow, laminar or rod-shaped.

The particles 204 can have an average diameter in a range of approximately 0.01 μm to approximately 10 μm, for example in a range of approximately 0.1 μm to approximately 5 μm, or can be formed in this way. Particles 204 that are non-scattering in the visible wavelength range can have for example an average diameter in a range of 10 nm to 100 nm or can be formed in this way. Particles 204 that are scattering in the visible wavelength range can have for example an average diameter $d_{50}$ in a range of 100 nm to 5 μm, depending on the wavelength and the angle of incidence of the electromagnetic radiation on the optically functional structure, or can be formed in this way.

The particles 204 can be distributed in the matrix 202 in such a way that the optically functional structure 104 in the visible wavelength range of the electromagnetic radiation has a layer-thickness-averaged refractive index difference with respect to the carrier 102 that is greater than 0.05.

In various embodiments, the particles 204 can be formed such that they have a refractive index that is less than 1.4 or greater than 1.6 in the visible wavelength range of the electromagnetic radiation.

In various embodiments, the particles 204 may include or be formed from a material that at least partly absorbs the electromagnetic radiation, for example a wavelength-converting material, for example a phosphor or colorant. In various embodiments, the particles 204 may include or be formed from a wavelength-converting material, for example a phosphor or colorant.

In various embodiments, the optically functional structure 104 is formed with or from at least one first layer 302 and one second layer 304. The first layer 302 and the second layer 304 can be formed identically or differently. In the case of an identical first layer 302 and second layer 304, an internal interface can be formed and/or be visible between the first layer 302 and the second layer.

In one embodiment, the optically functional structure 104 can be formed as a mirror structure, for example as a photonic crystal.

In various embodiments, the optically functional structure 104 is formed with a substantially homogeneous cross section.

In various embodiments, the optically functional structure 104 is formed laterally between the first electrical busbar 108-1 and the second electrical busbar 108-2. In other words: the optically functional structure 104 can be laterally delimited by the first electrical busbar 108-1 and the second electrical busbar 108-2 and/or the first electrical busbar 108-1 and the second electrical busbar 108-2 can be embedded in the optically functional structure.

In various embodiments, the optically functional structure 104 is formed in such way that the first electrical busbar 108-1 and the second electrical busbar 108-2 are exposed.

In various embodiments, the optically functional structure 104 is formed in such a way that the optically functional structure 104 overfills the first electrical busbar 108-1 and/or the second electrical busbar 108-2. The overfilled part of the optically functional structure 104 can for example be formed with a substantially smooth surface or form such a smooth surface, for example at least in the region of the overfilled busbar.

The optically functional structure 104 is formed in such a way that it reduces the roughness of the exposed surface 118 of the substrate 130, for example planarizes the surface.

In various embodiments, the substrate 130 is formed with an electrical insulation between the optically functional structure 104 and the first electrical busbar 108-1 and/or the second electrical busbar 108-2. The electrical insulation can be formed in such a way that the optically functional structure 104 is electrically insulated at least from one of the electrical busbars.

In various embodiments, the optically functional structure 104 is formed as a coupling structure with respect to the electromagnetic radiation, for example as a coupling-in structure or extraction structure, for example for the visible wavelength range of the electromagnetic radiation.

In various embodiments, the optically functional structure 104 is formed with respect to the refractive index of the carrier 102 and/or the refractive index of the optically active layer that can be formed above the optically functional structure 104 in such a way that that proportion of the electromagnetic radiation which is transmittable through the substrate 130 is greater than in the case of the substrate 130 without an optically functional structure 104.

In various embodiments, the optically functional structure 104 is formed with at least one region or as at least one region which acts as a waveguide for at least part of the electromagnetic radiation, for example with respect to a wavelength range and/or a polarization direction of the electromagnetic radiation, for example in the visible wavelength range, for example for unpolarized light.

In various embodiments, the optically functional structure 104 is formed as the core of a waveguide for the electromagnetic radiation and the first electrical busbar 108-1 and the second electrical busbar are formed as the cladding of the waveguide.

In various embodiments, the optically functional structure 104 with the electrical busbars 108-1/2 is formed or acts as an optical lens for the incident electromagnetic radiation. The incident electromagnetic radiation can thereby be for example focusable, collimatable or expandable.

In various embodiments, the optically functional structure 104 is formed as a filter structure of the electromagnetic radiation, for example with respect to at least one wavelength range and/or a polarization direction, for example as a bandpass, long-pass, short-pass or cut-off filter, for example with respect to UV radiation and/or infrared radiation.

In various embodiments, the optically functional structure 104 is formed as an antireflection coating, for example with respect to at least one wavelength range, for example in the visible wavelength range.

In various embodiments, the optically functional structure 104 is formed as a wavelength-converting structure. The wavelength-converting structure includes a colorant or phosphor, for example.

Furthermore, the method 600 for producing a lighting device 100 includes forming 606 an electrically active region 106 on or above the substrate 130.

Forming 606 the electrically active region 106 includes forming an organic functional layer structure 412 on or above the substrate 130 and forming a second electrode 414 on the organic functional layer structure 412.

The organic functional layer structure 412 is formed for converting an electric current into an electromagnetic radiation.

The optically functional structure 104 is formed in such a way that the beam path of the electromagnetic radiation through the substrate 130 and/or the spectrum of the electromagnetic radiation are/is variable.

In various embodiments, a first electrode 410 is formed on or above the substrate 130, and the organic functional layer structure 412 is formed on or above the first electrode 410. However, forming the organic functional layer structure 412 on or above a first electrode 410 formed on or above the substrate 130 can also be optional. By way of example, the current distribution structure 110 having at least one electrical busbar 108 and optically functional structure 104 can act as first electrode for the organic functional layer structure 412.

In various embodiments, the first electrode 410 is formed between the optically functional structure 104 and the first electrical busbar 108-1 and/or the second electrical busbar 108-2. Alternatively or additionally, the first electrode 410 can be formed between the carrier 102 and the first electrical busbar 108-1 and/or the second electrical busbar 108-2.

In various embodiments, the first electrical busbar 108-1 and the second electrical busbar 108-2 can be formed above the carrier 102 on the first electrode 410. Alternatively or additionally, the optically functional structure 104 can be formed above the carrier 102 on the first electrode 410.

In various embodiments, the first electrode 410 is formed on the first electrical busbar 108-1, the second electrical busbar 108-2 and/or the optically functional structure 104.

In one embodiment, the method furthermore includes forming at least one further electrode in such a way that the first electrode 410 and/or the second electrode are/is formed as intermediate electrode(s) 418.

In various embodiments, the first electrical busbar 108-1 is formed such that it is electrically insulated electrically from the second electrical busbar 108-2n; and the first electrical busbar 108-1 is formed such that it is electrically coupled to the first electrode 410 and the second electrical busbar 108-2 is formed such that it is electrically coupled to the second electrode 414 of the lighting device.

The current distribution structure 110 for example in the form of the first electrical busbar 108-1 and/or the second electrical busbar 108-2 may include one or more lines formed such that they extend along the interface 118 of the substrate 130 with the electrically active region 106.

In various embodiments, the current distribution structure 110 is formed with or from at least one electrical busbar 108 and (optionally) electrically conductive through contacts, where the through contacts are formed such that they are electrically conductively connected to the at least one electrical busbar 108, in such a way that the at least one electrical busbar 108 is electrically conductively couplable to the optoelectronic component by means of the through contacts, for example to the first electrode 410 or the second electrode 414 of the lighting device.

In one embodiment, the particles 204 can be distributed in the matrix 202 in such a way that the optically functional structure 104 in the visible wavelength range of the electromagnetic radiation has a layer-thickness-averaged refractive index difference with respect to the electrically active region 106 and/or the carrier 102 that is greater than 0.05.

In various embodiments, a lighting device and a method for producing a lighting device are provided which make it possible to realize novel substrate concepts. One of these novel concepts involves bringing together electrical busbars and an optically functional structure, for example an internal extraction layer (IEL), in one plane, such that they form for example a substantially plane surface. As a result, a busbar structure can be combined with an optically functional layer in a simple and effective manner. As a result, the substrate remains planar and has no elevated structures.

By printing the material of the electrical busbar(s), also designated as busbar material, and the optically functional structure for example as internal extraction layer, it is possible to enable simple and effective combinations of the materials of the electrical busbar and the optically functional structure. The advantage of the structures illustrated above resides in the simplification of the construction of the substrate, for example for organic light emitting diodes. In particular, it is possible to form a plane composed of substrate and internal extraction layer, which can lead to a reduction of possible defects. The latter can often occur at the flanks of a resist above the electrical busbar. Furthermore, the layers or applied subsequent organic functional materials and/or electrode materials formed on the substrate can be deposited homogeneously, for example since there are no flanks or edges at the surface of the substrate. Furthermore, further wet coatings can be implemented on the plane surface, since no accumulation of material in front of elevated structures can occur. Vapor-deposited or wet-deposited layers can be deposited more homogeneously.

Furthermore, the at least one electrical busbar and the optically functional structure can be formed such that no vertical stacking of the electrical busbar and optically functional structure is formed. This can lead to a material saving and an improved further utilizability of the layers.

Furthermore, the anode can be formed above the electrical busbar and/or optically functional structure. This can make it possible that all further vacuum processes, for example cathode sputtering, vaporization of the organic system and cathode can be performed in one process without vacuum interruption.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A lighting device, comprising:
   a substrate having a carrier,
      a first electrical busbar on or above the carrier;
      a second electrical busbar on or above the carrier; and
      an electrically conducting and optically functional structure on or above the carrier, wherein the electrically conducting and optically functional structure is formed laterally between the first electrical busbar and the second electrical busbar; and
   a first electrode, which is electrically coupled to the first electrical busbar and/or the second electrical busbar, on or above the carrier; and
   an organic functional layer structure on or above the first electrode, wherein the organic functional layer structure is formed for converting an electric current into an electromagnetic radiation; and
   a second electrode on or above the organic functional layer structure;
   wherein the electrically conducting and optically functional structure is formed in such a way that the beam path of the electromagnetic radiation which passes through the substrate and/or the spectrum of the electromagnetic radiation passing through the substrate are/is variable by means of the electrically conducting and optically functional structure,
   wherein the electrically conducting and optically functional structure comprises electrically conducting particles in a matrix, and
   wherein the electrically conducting particles are formed such that they are non-scattering with respect to visible light and are distributed in the matrix in such a way that the optically functional structure in the visible wavelength range of the electromagnetic radiation has a layer-thickness-averaged refractive index difference relative to the carrier which is greater than 0.05.

2. The lighting device as claimed in claim 1,
wherein the first electrical busbar and/or the second electrical busbar are/is formed in such a way that they/it have/has a ratio of height to width of greater than 1 to 10.

3. The lighting device as claimed in claim 1,
wherein the electrically conducting particles comprise or are formed from a material that at least partly absorbs the electromagnetic radiation.

4. The lighting device as claimed in claim 1,
wherein the electrically conducting and optically functional structure comprises at least one first layer and one second layer, wherein the first layer and the second layer are formed identically or differently.

5. The lighting device as claimed in claim 1,
wherein the electrically conducting and optically functional structure is formed in such a way that the electrically conducting and optically functional structure overfills the first electrical busbar and/or the second electrical busbar in such a way that the overfilled part forms a substantially smooth surface at least in the region of the overfilled busbar.

* * * * *

UNITED STATES PATENT AND TRADEMARK OFFICE
CERTIFICATE OF CORRECTION

PATENT NO. : 9,960,381 B2  
APPLICATION NO. : 15/310469  
DATED : May 1, 2018  
INVENTOR(S) : Wehlus et al.

Page 1 of 1

It is certified that error appears in the above-identified patent and that said Letters Patent is hereby corrected as shown below:

In the Specification

Column 8, Line 37: Please delete "C--O--H" and write -- C-O-O-H -- in place thereof.

Signed and Sealed this  
Seventeenth Day of July, 2018

Andrei Iancu  
*Director of the United States Patent and Trademark Office*